(12) United States Patent
Oyamada (10) Patent No.: US 8,502,208 B2
(45) Date of Patent: Aug. 6, 2013

(54) ORGANIC LIGHT-EMITTING DEVICE

(75) Inventor: Takahito Oyamada, Kawasaki (JP)

(73) Assignee: Pioneer Corporation, Kawasaki-shi, Kanagawa (JP)

(*) Notice: Subject to any disclaimer, the term of this patent is extended or adjusted under 35 U.S.C. 154(b) by 99 days.

(21) Appl. No.: 12/993,770

(22) PCT Filed: May 21, 2008

(86) PCT No.: PCT/JP2008/059349
§ 371 (c)(1),
(2), (4) Date: Nov. 19, 2010

(87) PCT Pub. No.: WO2009/141903
PCT Pub. Date: Nov. 26, 2009

(65) Prior Publication Data
US 2011/0062481 A1    Mar. 17, 2011

(51) Int. Cl.
*H01L 35/24* (2006.01)
*H01L 21/00* (2006.01)

(52) U.S. Cl.
USPC .......... 257/40; 257/81; 257/98; 257/432; 257/459; 257/E25.028; 438/29; 438/65; 438/82; 438/99

(58) Field of Classification Search
None
See application file for complete search history.

(56) References Cited

U.S. PATENT DOCUMENTS

| | | |
|---|---|---|
| 2007/0114523 A1 | 5/2007 | Oumi et al. |
| 2007/0176174 A1 | 8/2007 | Lee et al. |
| 2008/0054783 A1* | 3/2008 | Xia .............................. 313/483 |
| 2010/0038633 A1* | 2/2010 | Yang et al. ...................... 257/40 |
| 2011/0031515 A1* | 2/2011 | Mizuno et al. .................. 257/89 |

FOREIGN PATENT DOCUMENTS

| | | |
|---|---|---|
| EP | 1 009 198 A1 | 6/2000 |
| JP | 2004-327195 | 11/2004 |
| JP | 2005-063704 | 3/2005 |
| JP | 2006-332046 | 12/2006 |
| JP | 2007-165284 | 6/2007 |
| JP | 2008-059905 | 3/2008 |
| WO | WO 2005/096407 A1 | 10/2005 |

* cited by examiner

*Primary Examiner* — Alonzo Chambliss
(74) *Attorney, Agent, or Firm* — Drinker Biddle & Reath LLP (57) ABSTRACT

An organic light-emitting device cutting off ambient light while keeping emission intensity includes a pair of first and second electrodes opposed to each other; and a plurality of organic semiconductor layers layered and disposed between the first and second electrodes, wherein the organic semiconductor layers include an organic light-emitting layer, the organic semiconductor device further comprising a light-scattering layer layered and disposed between the organic light-emitting layer and at least one of the first and second electrodes. The light-scattering layer includes: organic materials having carrier injection and transport characteristics of transporting electrons and/or holes; and plural particles dispersed among the organic materials so that light emitted from the organic light-emitting layer is passed therethrough.

16 Claims, 8 Drawing Sheets

PRIOR ART

FIG. 1

LIGHT EMISSION

ORGANIC LIGHT-EMITTING DEVICE

TECHNICAL FIELD

The present invention relates to one of organic semiconductor devices, which utilizes an organic compound which exhibits electroluminescence (hereinafter referred to as EL) when electric current is caused to flow thereinto, and particularly an organic light-emitting device comprising an organic light-emitting layer made of such an EL organic compound.

BACKGROUND ART

In general, while an organic light-emitting device using an EL organic compound material is an electric current-injection type device having characteristics of a diode. There has been developed a display panel comprising organic light-emitting devices that emit light of two or more luminescent colors and are laid out in a matrix form.

Figure 1:
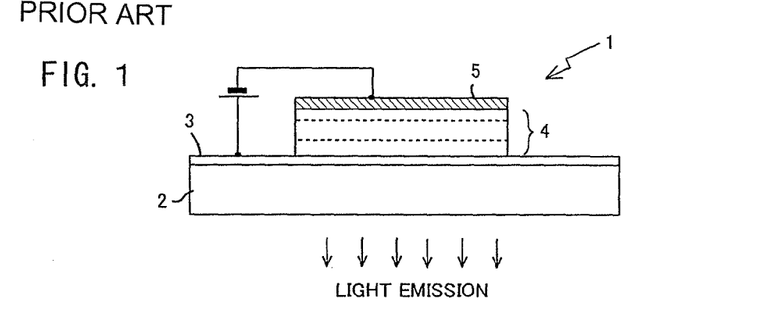
FIG. 1 is a schematic partial cross-section view of an organic light-emitting device.

As shown in FIG. 1, each of the organic light-emitting devices 1 is composed of e.g., on a transparent substrate 2, a transparent anode 3, plural organic compound material layers 4 including a light-emitting layer, and a reflective metallic cathode 5, which are serially formed by using a vacuum evaporation method or the like. Thus, the organic compound material layers 4 have functional layers sandwiching the light-emitting layer, i.e., appropriate hole transport functional layers (e.g., a hole injection layer, a hole transport layer) on the anode side and appropriate electron transport functional layers (e.g., an electron injection layer, an electron transport layer) on the cathode side.

In an organic EL display apparatus, there may be a contrast deterioration of the panel at a light-place due to a high reflectance of the cathode made of Al or the like in the organic light-emitting device. Therefore there is a suggestion that a circular polarized light filter is adhered on the transparent substrate on the side of extracting EL emissions to the outside (see Patent Literature 1). Further, there is another suggestion of a configuration of the organic EL display apparatus in which its light absorption layer is made of a matrix material includes metal nanoparticles and disposed near to the electrode to improve the contrast of organic EL display apparatus (see Patent Literature 2).

Patent Literature 1: Japanese Unexamined Patent Publication No. 2004-327195
Patent Literature 2: Japanese Unexamined Patent Publication No. 2006-332046

DISCLOSURE OF THE INVENTION

Problem to be Solved by the Invention

In a conventional organic light-emitting device using a circular polarized light filter, the circular polarized light plate can cut off ambient light, but bring a problem of decrease of EL emission intensity.

In addition, the inventor has revealed that a light extraction yield is insufficient in the organic EL display apparatus using the light absorption layer including metal nanoparticles in the light extraction side.

There have been demands for an organic light-emitting device technology capable of cutting off ambient light while keeping emission intensity.

Accordingly, there is one of exemplary tasks to be achieved by the present invention to provide an organic light-emitting device with a simple configuration that is capable of cutting off ambient light while keeping an emission intensity in EL light (EL luminance) higher than that of the device using the circular polarized light filter, by using the light-scattering technology and light canceling technology for a transparent members therein.

Means for Solving the Problem

An organic light-emitting device according to the present invention is an organic light-emitting device comprising: a pair of first and second electrodes opposed to each other; and a plurality of organic semiconductor layers layered and disposed between the first and second electrodes, wherein the organic semiconductor layers include an organic light-emitting layer, the organic semiconductor device further comprising a light-scattering layer layered and disposed between the organic light-emitting layer and at least one of the first and second electrodes. The light-scattering layer includes: organic materials having carrier injection and transport characteristics of transporting electrons and/or holes; and plural particles dispersed among the organic materials so that light emitted from the organic light-emitting layer is passed therethrough.

Due to the above configuration of the invention, the light-scattering layer is introduced into the device; it reduces an interference effect so that settings of elements are allowed in a status unrestricted relatively. Therefore, the present invention will provide a device with an emission yield higher than that of the device using the circular polarized light filter even under there is a large thickness of the organic layers.

EXPLANATION OF REFERENCE NUMERALS 46 anode (equivalent to the first electrode)
47 hole injection layer
47a light-scattering layer
48 hole transport layer
49 organic light-emitting layer
50 electron transport layer
51 electron injection layer
51a light-scattering layer
52 cathode (equivalent to the second electrode)
99 semi-transparent metal layer

DETAILED DESCRIPTION OF THE INVENTION

Following is a description of embodiments of the present invention, with reference to the drawings.

Figure 2:
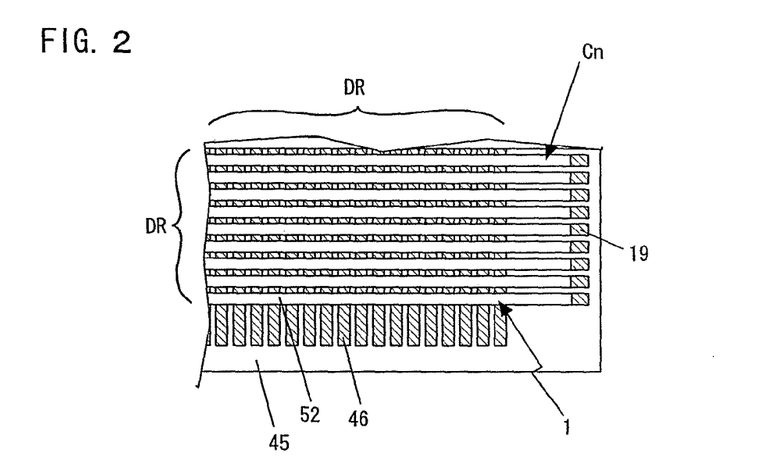
FIG. 2 is a rear view of a partially enlarged portion of a passive driven type organic EL display panel to which a plurality of organic light-emitting devices are applied as an example of display panels according to the present invention.

FIG. 2 is a rearview of a partially enlarged portion of a passive driven type organic EL display panel to which a plurality of organic light-emitting devices are applied as an example of display panels. In the figure, pluralities of light-emitting devices 1 are arranged in a matrix shape on a substrate 45. This organic EL display panel comprises a plurality of first electrodes 46 of row electrodes that contain transparent electrode layers; organic semiconductor layers; and a plurality of second electrodes 52 of column electrodes that contain metal electrode layers each intersecting the row electrodes, in which the first electrodes, the organic semiconductor layers and the second electrodes are layered sequentially on the substrate 45. The row electrodes are each formed in a strip shape, and are arranged parallel to one another with a predetermined spacing therebetween; likewise the column electrodes. Thus the matrix display panel comprises a displaying region DR constructed from emitters of the organic light-emitting devices 1 which are formed at the points of intersection between plural row electrodes and plural column electrodes respectively. The second electrodes 52 are connected via connection portions Cn to wiring electrodes 19 respectively. In addition s sealing film (not shown) is formed on and over the second electrodes 15, which is an inorganic passivation film made of inorganic, e.g., nitrides such as silicon oxynitride, silicon nitride and the like or oxides or carbides and the like. The sealing film of inorganic passivation film may be formed as a multilayer film including synthetic resin films layered by turns therebetween such as fluorocarbon polymers, silicone polymers, photo-resists, polyamides and the like, thereby the organic light-emitting devices are cut off from the air. The organic light-emitting layers may be made of organic compound materials exhibiting red, green and blue emissions with electric current applications respectively. In other words, the organic light-emitting devices are formed up as appropriate so as to constitute red, green and blue luminescent parts. The organic light-emitting device may be constructed as a bottom emission type one in which luminescent light is took out form the substrate 45 made of a transparent material on which a transparent electrode of the first electrode is formed and the second electrode is a metallic electrode, and alternatively the organic light-emitting device may be constructed as a top emission type one in which the first electrode is a metallic electrode and the second electrode is a transparent electrode.

Figure 3:
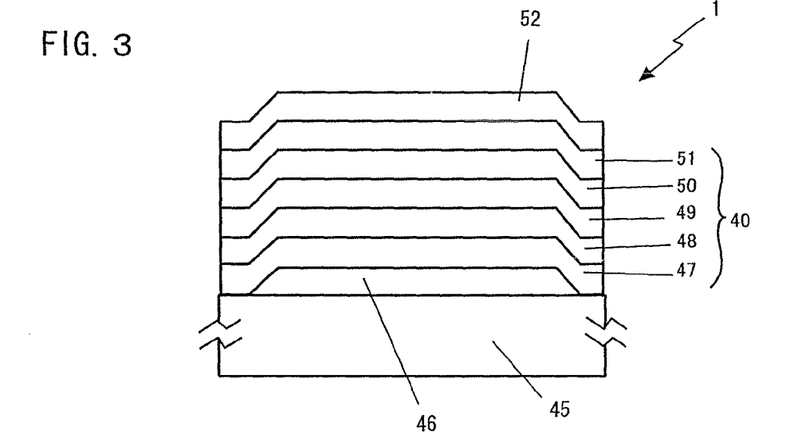
FIG. 3 is a schematic sectional view of a basic organic EL device according to an embodiment of the present invention.

FIG. 3 shows a basic organic semiconductor layers 40 for example, in which plural organic material films having functions respectively are layered in turn between from an anode of the first electrode 46 to a cathode of the second electrode 52 as follows: hole injection layer 47/hole transport layer 48/light-emitting layer 49/electron transport layer 50/electron injection layer 51, wherein "/" denotes an interface as a partition between layers. Further, an electron blocking layer may be layered between the hole transport layer and the light-emitting layer as an organic material film, and also a hole blocking layer may be layered between the light-emitting layer and the electron transport layer as an organic material film. Besides the organic light-emitting device may have a configuration including a layer in which electrical carriers and excitons dispersed therein in order to shut electrical carriers and excitons in the light-emitting layer 49. Besides, there may be omitted any one of the hole injection layer, the hole transport layer, the electron transport layer, the electron injection layer, the electron blocking layer and the hole blocking layer, excepting the light-emitting layer.

A basic scheme of individual organic light-emitting device 1 will be explained as a precondition, using FIG. 3. For example, the bottom emission type of a basic organic light-emitting device shown in the figure comprises a first electrode 46, organic semiconductor layers 40 including an organic light-emitting layer 49, and a second electrode 52 which are layered sequentially from the side of the substrate 45, light extraction is preformed on the side of the substrate 45. Here, in the case that the first electrode 46 and the second electrode 52 are the anode and the cathode respectively, holes are injected from the first electrode 46 of the anode, electrons are injected from the second electrode 52 of the cathode into the light-emitting layer mainly made of organic compounds of the organic semiconductor layers 40, so that electrons and holes recombine, and light is produced.

Figure 4:
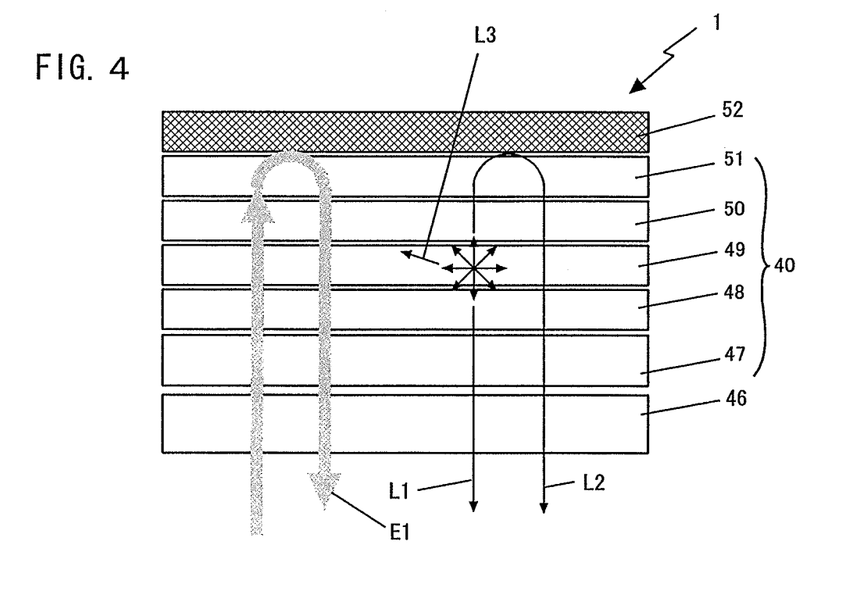
FIG. 4 is a schematic image diagram showing a cross-section of an organic light-emitting device shown in FIG. 3 for explaining typical optical paths.

FIG. 4 is a schematic image diagram showing a cross-section of one example of an organic light-emitting device shown in FIG. 3 for explaining typical optical paths. In the figure, gaps are drawn between the layers, since only the figure of being easily observed is taken into consideration. The organic light-emitting device 1 has a configuration, on the glass substrate, the transparent anode 46, the hole injection layer 47, the hole transport layer 48, the light-emitting layer 49, the electron transport layer 50, the electron injection layer 51 and the metal cathode 52 are layered in turn.

The EL emission is preformed in various directions due to the recombination of electrons and holes in the light-emitting layer 49 of the organic light-emitting device. Each light ray at each emission site is produced in the light-emitting layer 49 on the optical path as follows: The light ray L1 (less than a critical angle on each interface) toward the anode 46 passes through the organic semiconductor layers 40 and the transmissive anode 46 to go out the organic light-emitting device as a output. Whereas, the light ray L2 toward the cathode 52 is reflected by the cathode 52, and passes through all of the organic semiconductor layers 40 and the anode 46 to go out the organic light-emitting device as a output (less than a critical angle on each interface). The rest of light L3 (a critical angle or more on each interface) emitted by the light-emitting layer 49 vanishes from the organic light-emitting device without extraction out of the organic light-emitting device to the outside.

In the basic configuration of the organic light-emitting device, ambient light entering from the outside passes through the organic semiconductor layers 40 and is reflected by the anode 46 and again passes through the organic semiconductor layers 40 to go out the organic light-emitting device. Therefore, a contrast deterioration of the device, particularly, at a light-place depends on the intensity ratio between the reflected ambient light E1 and the EL emission light of the light-emitting layer 49.

<Component Materials of the Organic Light-Emitting Device>

The substrate 45 is made of a transparent substance such as glass, plastics or like, alternatively, may be of a semi-transparent or opaque material. The anode 46 is made of an oxide such as ITO (Indium Tin Oxide), IZO (Indium Zinc Oxide), Tin Oxide or the like of transparent materials. The anode 46 may be a thin film made of gold, palladium or the like such as Au, Ag, Cu, Si, Pt, Pd and the like or an alloy thereof. In addition, the anode 46 may be made of Al, Mo, Ti or the like. A material of the anode 46 may be conductive carbon, polyanilines, polythiophenes, polypyrroles or the like of n-conjugated polymers or the like. A material of the cathode 52 may be a substance with a low work function employed for the interface in contact with the organic semiconductor layers 40 such as alkaline metal, Lithium, Sodium or the like, or, alkaline-earth metal i.e., Group IIA, Beryllium, Magnesium, Calcium, Barium or the like, or, Group III metal including rare earth metals such as Scandium, Yttrium, Lanthanum, cerium, Europium, Terbium or the like, or, Actinides metal such as Actinium or the like, or, an alloy of those, but not limited to those materials. The cathode 52 may be formed as a multi-layered film layered or composed of a substance layer with a low work function and the other metal layer that is employed for the interface in contact with the organic semiconductor layers 40.

The hole injection layer 47 has a function for facilitating to extract holes from the anode 46. This hole injection layer 47 may be, for example, made of one of materials of, specifically is not limited thereto, metal phthalocyanines such as CuPc (Copper Phthalocyanine) or the like or inorganic phthalocyanines, carbon films, PEDOT (i.e., Poly(3,4-ethylenedioxythiophene)), polyanilines, Poly(p-phenylenevinylene) derivatives, polythiophene derivatives, Poly-p-phenylene derivatives, Polyalkylphenylene derivatives, polyacetylene derivatives or the like preferably.

The hole transport layer 48 has a function for transporting holes to the organic light-emitting layer 49, these holes extracted by the hole injection layer 47 from the anode 46. This hole transport layer 48 may be made of, for example, one of organic compounds capable of transporting holes, such as N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, Bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostilbenzene, N-phenylcarbazole,1,1-bis(4-di-p-triaminophenyl)cyclohexane, 1,1-bis(4-di-p-triaminophenyl)-4-phenylcyclohexane, Bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]naphthalene, 4,4'-bis[N-(9-anthryl)-N-phenylamino]biphenyl, 4,4''-bis[N-(1-anthryl)-N-phenylamino]p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di(2-naphthyl)amino]fluorene, 4,4''-bis(N,N-di-p-tolylamino)terphenyl, Bis(N-1-naphthyl) (N-2-naphthyl)amine or the like. In addition, these hole transport materials partially include substances serving as the hole injection layer.

The light-emitting layer 49 is equivalent to a photoelectric conversion layer that has a function for emitting light by an electric field caused by a voltage applied across the first and second electrodes. The light-emitting layer 49 utilizes a light emission phenomenon based on the energy received with the outside electric field to emit light itself.

The electron transport layer 50 has a function for effectively transporting electrons to the light-emitting layer 49, these electrons extracted by the electron injection layer 51 from the cathode 52. For example, organic compounds capable of transporting electrons and a main component used for the light-emitting layer 49 or the electron-transporting organic semiconductor layer are as follows: polycyclic compounds such as p-terphenyl, quaterphenyl as well as derivatives thereof, condensed polycyclic hydrocarbon compounds such as naphthalene, tetracene, pyrene, coronene, chrysene, anthracene, diphenylanthracene, naphthacene, phenanthrene as well as derivatives thereof, condensed heterocyclic compounds such as phenanthroline, bathophenanthroline, phenanthridine, acridine, quinoline, quinoxaline, phenazine and the like as well as derivatives thereof, and fluoroceine, perylene, phthaloperylene, naphthaloperylene, perynone, phthaloperynone, naphthaloperylene, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene as well as derivatives thereof. In addition, other organic compounds capable of transporting electrons used for the device are as follows: metal-chelated complex compounds, specifically suitable metal-chelated oxanoide compounds are metal complexes which contain, as a ligand thereof, at least one selected from 8-quinolinolato and derivatives thereof such as tris(8-quinolinolato)aluminum, which is a fluorescent substance, bis(8-quinolinolato)magnesium, bis[benzo(f)-8-quinolinolato]zinc, bis(2-methyl-8-quinolinolato)aluminum, tri(8-quinolino lato)indium, tris(5-methyl-8-quinolinolato)aluminum, 8-quinolinolatolithium, tris(5-chloro-8-quinolinolato)gallium, and bis(5-chloro-8-quinolinolato)calcium.

Further, other organic compounds capable of transporting electrons, such as oxadiazoles, triazines, stilbene derivatives and distyrylarylene derivatives, styryl derivatives, diolefin derivatives can be used preferably for the device.

Furthermore, other organic compounds capable of transporting electrons used for the device are as follows: the group of benzoxazoles such as 2,5-bis(5,7-di-t-pentyl-2-benzoxazolyl)-1,3,4-thiazole, 4,4'-bis(5,7-t-pentyl-2-benzoxazolyl) stilbene, 4,4'-bis[5,7-di(2-methyl-2-butyl)-2-benzoxazolyl] stilbene, 2,5-bis(5,7-di-t-pentyl-2-benzoxazolyl)thiophene, 2,5-bis[5-($\alpha,\alpha$-dimethylbenzyl)-2-benzoxazolyl]thiophene, 2,5-bis[5,7-di(2-methyl-2butyl)-2-benzoxazolyl]-3,4-diphenyl thiophene, 2,5-bis(5-methyl-2-benzoxazolyl)thiophene, 4,4'-bis(2-benzoxazolyl)biphenyl, 5-methyl-2-{2-[4-(5-methyl-2-benzoxazolyl)phenyl]vinyl}benzo xazole, 2-[2-(4-chlorophenyl)vinyl]naphtho(1,2-d)oxazole and the like, the group of benzothiazoles such as 2,2'-(p-phenylenedipynylene)-bisbenzo thiazole, and the group of benzoimidazoles such as 2-{2-[4-(2-benzoimidazolyl)phenyl]vinyl}benzoimidazole, and 2-[2-(4-carboxyphenyl)vinyl] benzoimidazole or the like.

Furthermore, other organic compounds capable of transporting electrons used for the device are as follows: 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, 1,4-bis(2-methylstyryl)-2-ethylbenzene or the like.

Still furthermore, other organic compounds capable of transporting electrons used for the device are as follows: 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, 2,5-bis[2-(1-pyrenyl)vinyl]pyrazine or the like.

Furthermore, other organic compounds capable of transporting electrons used for the device are as follows: 1,4-phenylene-dimethylidine, 4,4'-phenylenedimethylidine, 2,5-xylylene-dimethylidine, 2,6-naphthylenedimethylidine, 1,4-biphenylene-dimethylidine, 1,4-p-terephenylenedimethylidine, 9,10-anthracenediyldimethylidine, 4,4'-(2,2-di-t-butylphenylvinyl)biphenyl, 4,4'-(2,2-diphenylvinyl) biphenyl or the like. In addition to these organic compounds, any of the well-known compounds conventionally used in the production of the prior art organic EL devices may be suitably used for the device.

Each of the organic semiconductor layers 40 is made of organic substances of small-molecules, or dendrimers of macromolecules. The organic semiconductor layers 40 made of small-molecule organic compounds are formed in general by a vacuum evaporation method or the like as a dry process (vacuum process), and the organic semiconductor layers 40 made of polymers or dendrimers of organic compounds are formed in general by a coating method. There are some small-molecule materials solvable in certain solvents and capable of be used in the coating method in parts, and there are some polymer materials capable of be used in the vacuum evaporation method in parts. Generally, materials of the light-emitting layer and the like used for the organic semiconductor layers 40 are belong to a P-type organic semiconductor, N-type organic semiconductor or a bipolar-type organic semiconductor.

Furthermore, in the case that the organic semiconductor layers 40 are polymer materials, the precursors thereof are dissolved in pertinent solvents respectively and the resultant solutions are coated. As solvents, there is used for one or more solvents selected from solvents such as toluene, benzene, chlorobenzene, dichlorobenzene, chloroform, Tetralin, xylene, Anisole, dichloromethane, $\gamma$ butyrolactone, butyl Cellosolve, cyclohexane, NMP (N-methyl-2-pyrrolidone), dimethyl sulfoxide, cyclohexanone, dioxane, or THF (tetrahydrofuran), or the like. In addition to the above-mentioned solvents, as known solvents, such as PGME (propyleneglycol monomethyl ether), PGMEA (propyleneglycol monomethyl ether acetate), Ethyl lactate, DMAc (N. N-dimethylacetamide), MEK (methyl ethyl ketone), MIBK (methyl isobutyl ketone), PSS (polystyrenesulfonate), IPA (isopropyl alcohol), ethanol and the like can be used. As a method of applying the precursor solution, there are the whole surface coating method for the substrate 45 such as a spin coating method, a blade coating method, a roll coating method, a spray coating method and the like, and the printing method such as a ink jet method, a flexo print process, a dispenser method and the like, and a predetermined patterned coating method.

Examples of the Organic Light-Emitting Device

Example NP

Figure 5:
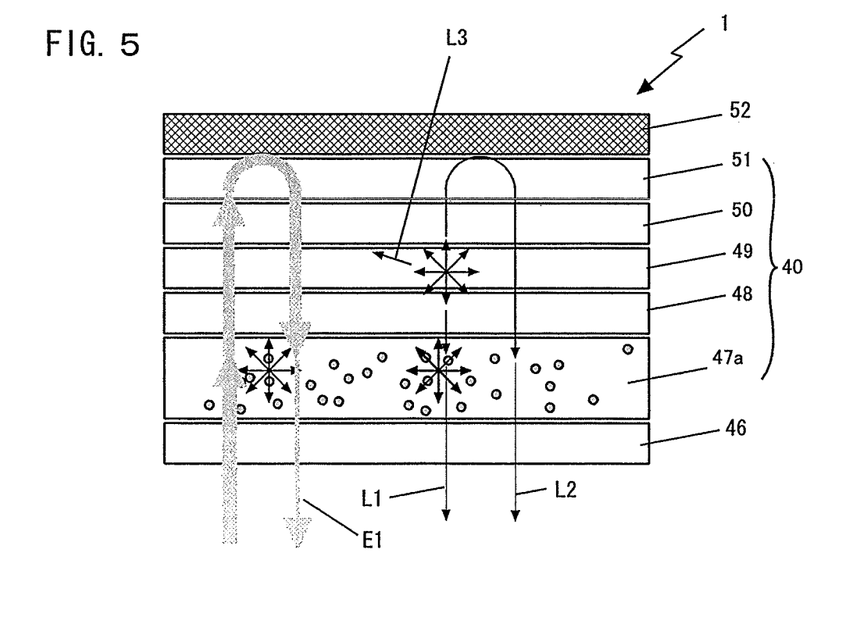
FIG. 5 is a schematic image diagram showing a cross-section of an organic light-emitting device of an embodiment according to the present invention for explaining typical optical paths.

FIG. 5 is a schematic image diagram showing a cross-section of an organic light-emitting device of Example NP for explaining typical optical paths. In the figure, gaps are drawn between the layers, since only the figure of being easily observed is taken into consideration. The organic light-emitting device 1 has a configuration, on the glass substrate, the transparent anode 46, the light-scattering layer 47a of the hole injection layer in which plural particles are dispersed, the hole transport layer 48, the light-emitting layer 49, the electron transport layer 50, the electron injection layer 51 and the metal cathode 52 are layered in turn. The light-scattering layer 47a is a thin film comprising a base material of the hole injection layer prepared to have a transmittance and to reflect partially light; and particles dispersed therein. The particles are, for example, metal nanoparticles of a metal such as Au, Ag or the like, or an oxide such as $TiO_x$, $ZrO_x$, $ZnO_x$, $MoO_x$, $WO_x$, $SiO_x$, $FeO_x$, $Y_xO_y$, $CuO_x$ or the like, or a complex oxide such as $TiMO_x$ (M=Si, Fe, Zr, Sn, Sb, W, Ce), $AgMoO_x$, $IMO_x$ (M=In, Zn) where the subscript x and y denote an atomic ratios, or the like including two kinds or more of metal ions, or a fluoride such as $AlF_2$, $MgF_2$ or the like, or a polymer material such as polystyrene or the like. Each particle has an acicular shape, cylinder shape, plate shape, rectangular parallelepiped shape, cube shape, cone shape, spherical shape, prism shape, or the like as an individual, or aggregation thereof. The particles have an average particle size ranging from 0.1 nm to 10000 nm. The radiuses of dispersed particle are extremely considerably small in comparison with wavelengths of entering ambient light, and the particle size distribution of the dispersed particles is set so as to generate the Rayleigh scattering. The particles are dispersed at a density so that a distance between adjacent particles is within a range of 0.1 nm or more and 1 µm or less. Material of particles is selected to have a refractive index satisfying a refractive index difference of 0.01 or more different from a refractive index of the organic materials of the organic semiconductor layer. The light-scattering layer 47a has an uneven or rough interface with a difference of elevation of 0.1 nm or more and 1000 nm or less. The light-scattering layer 47a is set to have a carrier mobility of $1\times10^{-10}$-$1\times10^{-10}$ cm$^2$/Vs, or a conductivity of $10^{10}$-$10^{-10}$ $\Omega\cdot$cm.

Although FIG. 5's device has the light-scattering layer functioning the hole injection layer with dispersed particles, the hole transport layer may be used as a light-scattering layer using dispersed particles therein or the like. Namely, the light-scattering layer may be layered and disposed anywhere between the organic light-emitting layer 49 and the anode 46 as an organic semiconductor layer.

Figure 6:
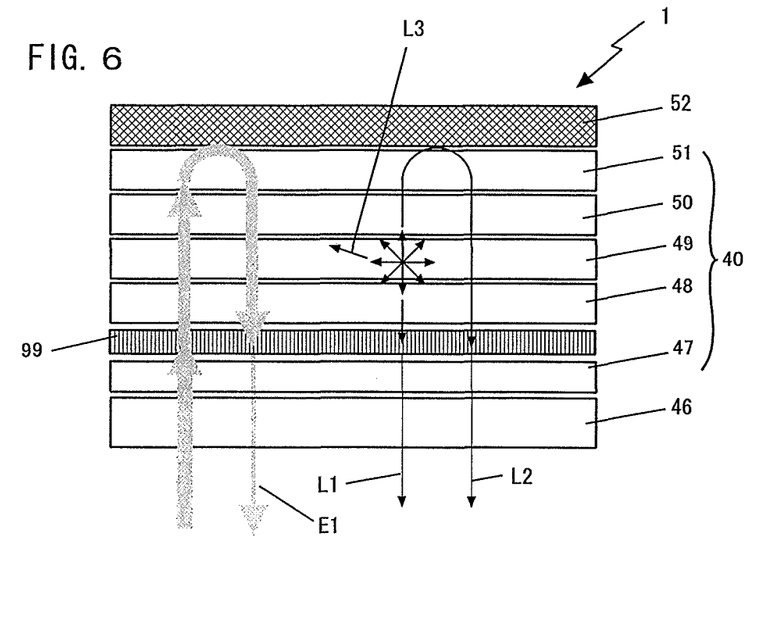
FIG. 6 is a schematic image diagram showing a cross-section of an organic light-emitting device of another embodiment according to the present invention for explaining typical optical paths.

Although the optical paths of EL emission light and ambient light in the light-emitting layer 49 of the organic light-emitting device shown in FIG. 5 are similar to those of the organic light-emitting device shown in FIG. 4, but, somewhat light within the light rays toward the anode 46, e.g., the light ray travelling along with the light-emitting layer 49 is scattered by the Rayleigh scattering of the light-scattering layer 47a. The scattered light ray goes out from the anode 46 to the outside of the organic light-emitting device as an output light. Since the light-scattering layer 47a improves the light extraction yield of the organic light-emitting device, the amount of light emission throughout the device increases. In this case, respective layers' refractive indexes are set as mentioned above so that lateral light propagation is restrained, resulting in improvement of a further light extraction yield. In this case, the intensity of scattered light due to Rayleigh scattering is inversely proportional to the fourth power of wavelength of ambient light Example BL FIG. 6 is a schematic image diagram showing a cross-section of an organic light-emitting device of Example BL for explaining typical optical paths. In the figure, gaps are drawn between the layers, since only the figure of being easily observed is taken into consideration. The organic light-emitting device 1 has a configuration, on the glass substrate, the transparent anode 46, the hole injection layer 47, the semi-transparent metal layer 99, the hole transport layer 48, the light-emitting layer 49, the electron transport layer 50, the electron injection layer 51 and the metal cathode 52 are layered in turn. The semi-transparent metal layer 99 is formed between the hole injection layer 47 and the hole transport layer 48. The semi-transparent metal layer 99 may be at least one thin film prepared to have a transmittance and to reflect light partially, for example, Ag and $MoO_3$ are contained therein. In addition, the semi-transparent metal layer 99 may be, for example, silver alloy thin film. Besides, metal for the layer alloy is not limited to silver, but gold may be employed for the layer alloy, for example. Oxide for the layer alloy is not limited to Mo oxide, but transition metal oxide may be employed for the layer alloy, for example. The semi-transparent metal layer 99 is deposited at a thickness in a range of 10 nm or more and 50 nm or less. In other words, the semi-transparent metal layer 99 is a transparent or semi-transparent thin film, having a high reflectance preferably, and having a refractive index lower than that of the adjacent layer preferably. For example, a simple substance film such as Ag, Au, Cu, Al, Pt, Mg, and an alloy-based thin film such as MgAg, MgAu and the like, an oxide thin film, a fluoride thin film, a mixture-based thin film made of oxide, fluoride and metal or the like may be employed for the semi-transparent metal layer 99. Specifically, an Ag-, Ag alloy-, or Mg alloy-based thin film has a high reflectance. An Ag bulk has a low refractive index of 1 or less. These thin films made of metal, or alloy-material may be used for a semi-transparent with 10 nm or more 50 nm or less in thick, for example. The an oxide thin film, the fluoride thin film, and the mixture-based thin film made of oxide, fluoride and metal may have a high transparency, so that its thickness is not limited. Further, these thin films are prepared to have 10 nm or less in thick and exhibit the surface roughness (interfaces are uneven). As a result, laterally propagated light is scattered toward the front face due to the surface roughness. The Au layer with a 3 nm thickness disposed on the substrate 45 has the surface roughness of 2.6 nm.

In the case that the semi-transparent metal layer 99 is prepared to have a thickness of, for example 10-50 nm, its transmittance is 1%-99% or less in a visible wavelength band of 400 nm-700 nm. Therefore, specifically 10-90%, more specifically 20-70% of transmittance of the layer 99 is obtained by the thickness settings. Further, the reflectance of the semi-transparent metal layer 99 may be obtained of 1%-99% or less, specifically 5-95%, more specifically 10-70% in the visible wavelength band of 400 nm-700 nm, by the thickness settings.

The light-emitting layer 49 is prepared to have a refractive index equal to or less than that of the adjacent layer preferably.

Although the optical paths of EL emission light and ambient light in the light-emitting layer 49 of the organic light-emitting device shown in FIG. 6 are similar to those of the organic light-emitting device shown in FIG. 4, but, a contrast of the device increases, particularly, at a light-place in response to the intensity ratio between the reflected ambient light E1 and the EL emission light of the light-emitting layer 49.

Example BL1

Figure 7:
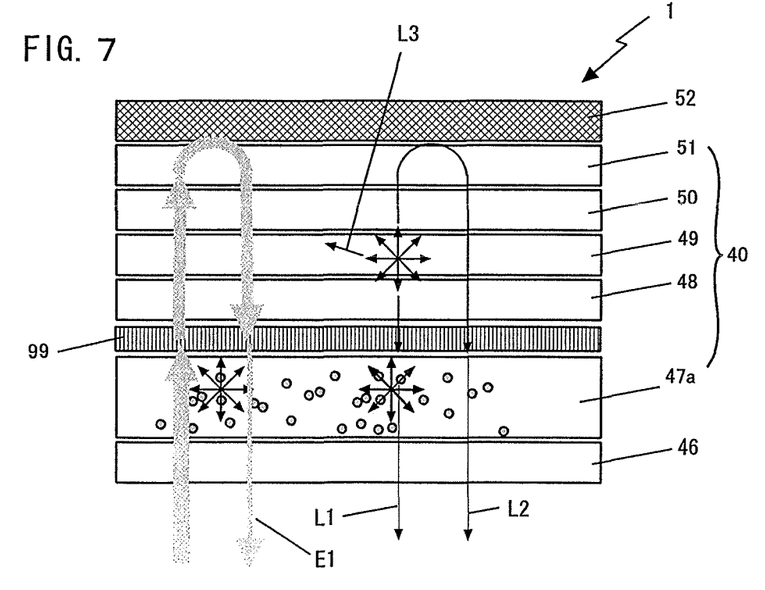
FIG. 7 is a schematic image diagram showing a cross-section of an organic light-emitting device of another embodiment according to the present invention for explaining typical optical paths.

FIG. 7 is a schematic image diagram showing a cross-section of an organic light-emitting device of Example BL1 for explaining typical optical paths. In the figure, gaps are drawn between the layers, since only the figure of being easily observed is taken into consideration. The organic light-emitting device 1 has a configuration, on the glass substrate, the transparent anode 46, the light-scattering layer 47a of the hole injection layer in which plural particles are dispersed, the semi-transparent metal layer 99, the hole transport layer 48, the light-emitting layer 49, the electron transport layer 50, the electron injection layer 51 and the metal cathode 52 are layered in turn. Example BL1 of the organic light-emitting device has a configuration so that the semi-transparent metal layer 99 (disposed between the light-scattering layer 47a and the hole transport layer 48) is added to FIG. 5's Example NP of the organic light-emitting device having the light-scattering layer 47a. The semi-transparent metal layer 99 has a transmittance and to reflect partially light, and may be at least one thin film that Ag and $MoO_3$ are contained therein similarly to FIG. 6's Example BL.

Although the optical paths of EL emission light and ambient light in the light-emitting layer 49 of the organic light-emitting device shown in FIG. 7 are similar to those of the organic light-emitting device shown in FIGS. 5 and 6, but, somewhat light within the light rays toward the anode 46, e.g., the light ray travelling along with the light-emitting layer 49 and passing through the semi-transparent metal layer 99 is scattered by the Rayleigh scattering of the light-scattering layer 47a. The scattered light ray goes out from the anode 46 to the outside of the organic light-emitting device as an output light. Since the light-scattering layer 47a improves the light extraction yield of the organic light-emitting device, the degree of contrast throughout the device increases.

Example BL2

Figure 8:
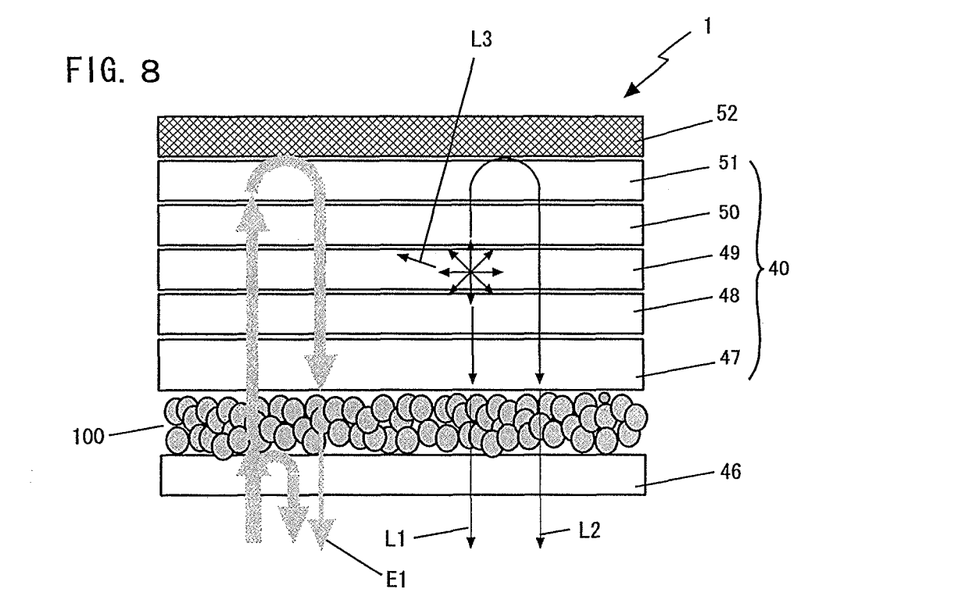
FIG. 8 is a schematic image diagram showing a cross-section of an organic light-emitting device of another embodiment according to the present invention for explaining typical optical paths.

FIG. 8 is a schematic image diagram showing a cross-section of an organic light-emitting device of Example BL2 for explaining typical optical paths. In the figure, gaps are drawn between the layers, since only the figure of being easily observed is taken into consideration. The organic light-emitting device 1 has a configuration, on the glass substrate, the transparent anode 46, the particulate film 100 containing plural particles, the hole injection layer 47, the hole transport layer 48, the light-emitting layer 49, the electron transport layer 50, the electron injection layer 51 and the metal cathode 52 are layered in turn. FIG. 8's Example BL2 of the organic light-emitting device is the same as FIG. 4's Example, excepting that the particulate film 100 is deposited between the anode 46 and the hole injection layer 47. The particulate film 100 is a thin film containing plural particles and prepared to have a transmittance and to reflect light partially. The particles of the particulate film 100 are made of oxide, complex oxide, fluoride, or metal, and the particulate film 100 is a cohesion film in which the particles cohered with an organic binder. The particulate film 100 may be used in a fashion of combined plural cohesion films. The particulate film 100 is deposited and formed at a thickness of a range 10-50 nm.

Although the optical paths of EL emission light and ambient light in the light-emitting layer 49 of the organic light-emitting device shown in FIG. 8 are similar to those of the organic light-emitting device shown in FIG. 4, but, a contrast of the device increases, particularly, at a light-place in response to the intensity ratio between the reflected ambient light E1 and the EL emission light of the light-emitting layer 49.

Here, in the case that particles of the particulate film, particles dispersed in the light-scattering layer, particles of the semi-transparent metal layer are metal, specifically, metal nanoparticles, Plasmon can couple with a photo electric field in a visible to near infrared wavelength range in the metal, so that specific photo energies are absorbed, whereby the Plasmon plays a brilliant role in tone of color of the metal. The Plasmon can be described as a collective oscillation of free electrons in metal and then the plasmons are localized at the surface in metal nanoparticles. This Surface Plasmon Resonance (SPR) generates an enhanced electric field remarkably localized. In other words, conversion from photo energies to the surface plasmon contributes accumulation of photo energies on the surface of metal nanoparticles and enables to control light at a minute region small than a diffraction limit of light.

Example BL3

Figure 9:
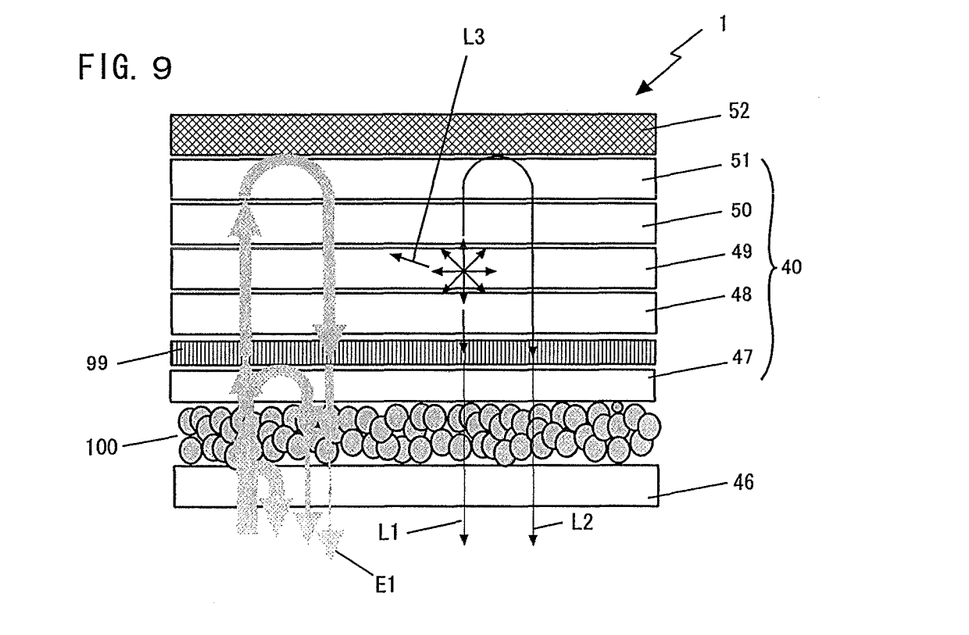
FIG. 9 is a schematic image diagram showing a cross-section of an organic light-emitting device of another embodiment according to the present invention for explaining typical optical paths.

FIG. 9 is a schematic image diagram showing a cross-section of an organic light-emitting device of Example BL3 for explaining typical optical paths. In the figure, gaps are drawn between the layers, since only the figure of being easily observed is taken into consideration. The organic light-emitting device 1 has a configuration, on the glass substrate, the transparent anode 46, the particulate film 100 containing plural particles, the hole injection layer 47, the semi-transparent metal layer 99, the hole transport layer 48, the light-emitting layer 49, the electron transport layer 50, the electron injection layer 51 and the metal cathode 52 are layered in turn. Example BL3 of the organic light-emitting device has a configuration so that the semi-transparent metal layer 99 (disposed between the hole injection layer 47 and the hole transport layer 48) is added to FIG. 8's Example BL2 of the organic light-emitting device having the light-scattering layer 47a. The semi-transparent metal layer 99 has a transmittance and to reflect partially light, and may be at least one thin film that Ag and $MoO_3$ are contained therein similarly to FIG. 6's Example BL.

Although the optical paths of EL emission light and ambient light in the light-emitting layer 49 of the organic light-emitting device shown in FIG. 9 are similar to those of the organic light-emitting device shown in FIG. 8, but, a contrast of the device increases, particularly, at a light-place in response to the intensity ratio between the reflected ambient light E1 and the EL emission light of the light-emitting layer 49.

Example BL4

Figure 10:
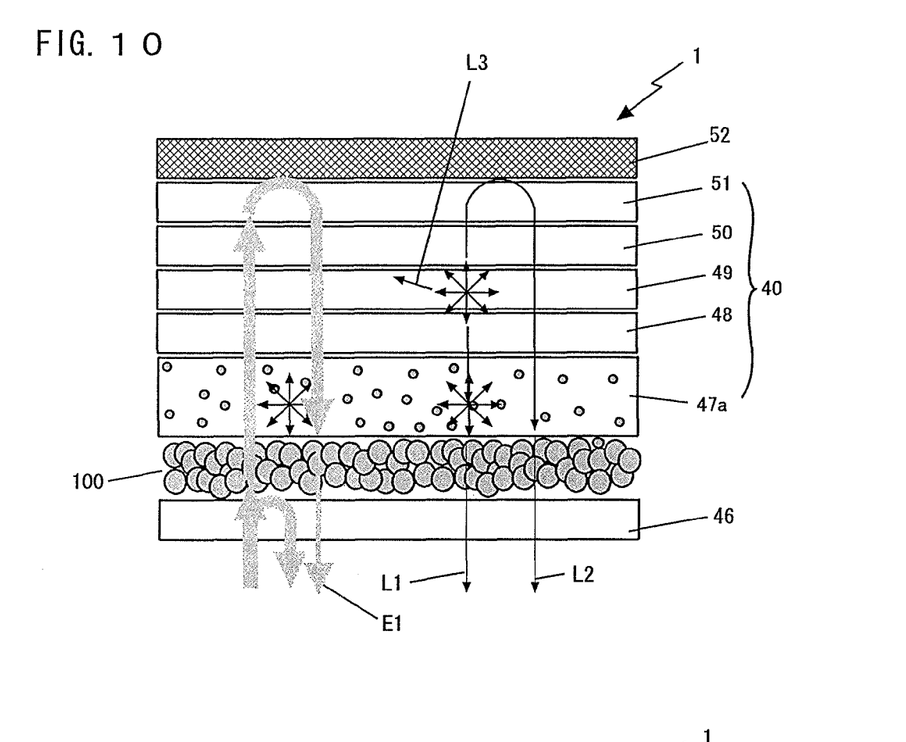
FIG. 10 is a schematic image diagram showing a cross-section of an organic light-emitting device of another embodiment according to the present invention for explaining typical optical paths.

FIG. 10 is a schematic image diagram showing a cross-section of an organic light-emitting device of Example BL4 for explaining typical optical paths. In the figure, gaps are drawn between the layers, since only the figure of being easily observed is taken into consideration. The organic light-emitting device 1 has a configuration, on the glass substrate, the transparent anode 46, the particulate film 100 containing plural particles, the light-scattering layer 47a of the hole injection layer in which plural particles are dispersed, the hole transport layer 48, the light-emitting layer 49, the electron transport layer 50, the electron injection layer 51 and the metal cathode 52 are layered in turn. Example BL4 of the organic light-emitting device has a configuration so that the particulate film 100 (disposed between the anode 46 and the light-scattering layer 47a) is added to FIG. 5's Example NP of the organic light-emitting device having the light-scattering layer 47a. The particulate film 100 is a thin film, similarly to FIG. 8's Example BL2, containing plural particles and prepared to have a transmittance and to reflect light partially.

Although the optical paths of EL emission light and ambient light in the light-emitting layer 49 of the organic light-emitting device shown in FIG. 10 are similar to those of the organic light-emitting device shown in FIGS. 5 and 6, but, somewhat light within the light rays toward the anode 46, e.g., the light ray travelling along with the light-emitting layer 49 is scattered by the Rayleigh scattering of the light-scattering layer 47a. The scattered light ray passes through the particulate film 100 and goes out from the anode 46 to the outside of the organic light-emitting device as an output light. Since the light-scattering layer 47a and the particulate film 100 improve the light extraction yield of the organic light-emitting device, the degree of contrast throughout the device increases.

Example BL5

Figure 11:
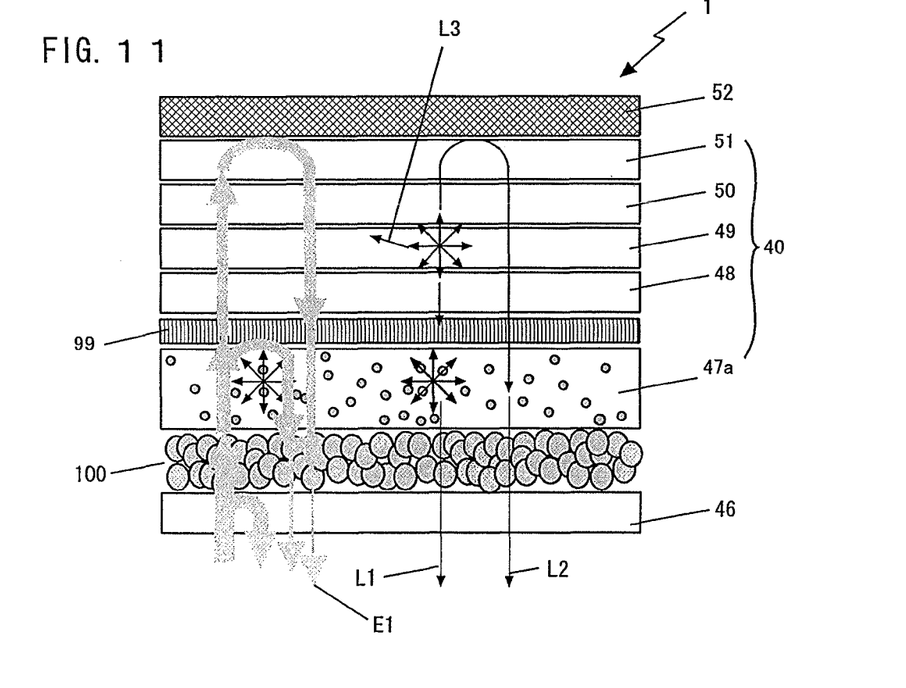
FIG. 11 is a schematic image diagram showing a cross-section of an organic light-emitting device of another embodiment according to the present invention for explaining typical optical paths.

FIG. 11 is a schematic image diagram showing a cross-section of an organic light-emitting device of Example BL5 for explaining typical optical paths. In the figure, gaps are drawn between the layers, since only the figure of being easily observed is taken into consideration. The organic light-emitting device 1 has a configuration, on the glass substrate, the transparent anode 46, the particulate film 100 containing plural particles, the light-scattering layer 47a of the hole injection layer in which plural particles are dispersed, the semi-transparent metal layer 99, the hole transport layer 48, the light-emitting layer 49, the electron transport layer 50, the electron injection layer 51 and the metal cathode 52 are layered in turn. Example BL5 of the organic light-emitting device has a configuration so that the particulate film 100 (disposed between the anode 46 and the light-scattering layer 47a) and the semi-transparent metal layer 99 (disposed between the light-scattering layer 47a and the hole transport layer 48) are added to FIG. 5's Example NP of the organic light-emitting device having the light-scattering layer 47a. The particulate film 100 is a thin film, similarly to FIG. 8's Example BL2, containing plural particles and prepared to have a transmittance and to reflect light partially. The semi-transparent metal layer 99 has a transmittance and to reflect partially light, and may be at least one thin film that Ag and MoO₃ are contained therein similarly to FIG. 6's Example BL.

Although the optical paths of EL emission light and ambient light in the light-emitting layer 49 of the organic light-emitting device shown in FIG. 11 are similar to those of the organic light-emitting device shown in FIGS. 5 and 6, but, somewhat light within the light rays toward the anode 46, e.g., the light ray travelling along with the light-emitting layer 49 passes through the semi-transparent metal layer 99 and is scattered by the Rayleigh scattering of the light-scattering layer 47a. The scattered light ray passes through the particulate film 100 and goes out from the anode 46 to the outside of the organic light-emitting device as an output light. Since the light-scattering layer 47a and the particulate film 100 improve the light extraction yield of the organic light-emitting device, the degree of contrast throughout the device increases.

Example BL6

Figure 12:
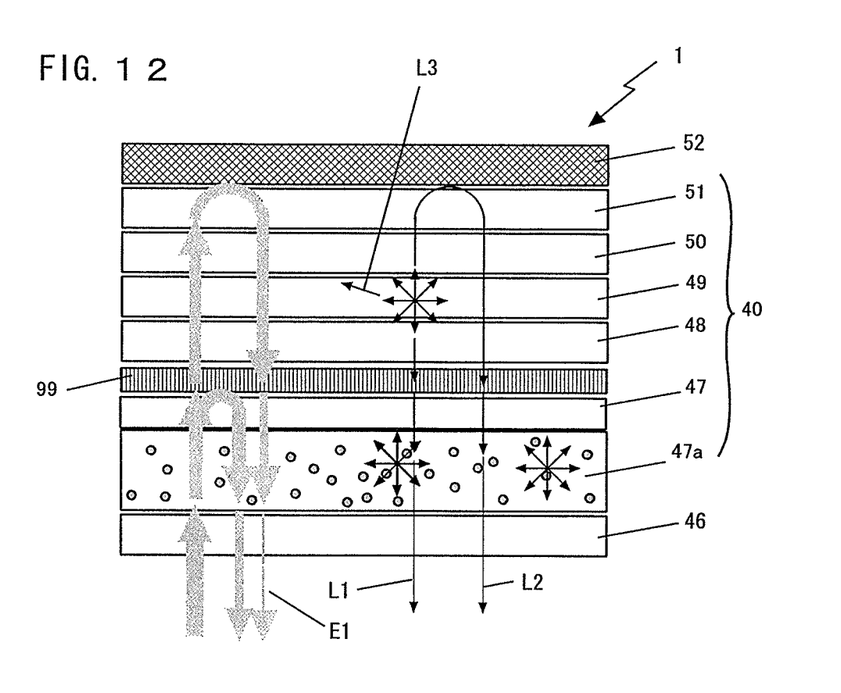
FIG. 12 is a schematic image diagram showing a cross-section of an organic light-emitting device of another embodiment according to the present invention for explaining typical optical paths.

FIG. 12 is a schematic image diagram showing a cross-section of an organic light-emitting device of Example BL6 for explaining typical optical paths. The organic light-emitting device 1 has a configuration, on the glass substrate, the transparent anode 46, the light-scattering layer 47a of the hole injection layer in which plural particles are dispersed, the hole injection layer 47, the semi-transparent metal layer 99, the hole transport layer 48, the light-emitting layer 49, the electron transport layer 50, the electron injection layer 51 and the metal cathode 52 are layered in turn. Example BL6 of the organic light-emitting device has a configuration so that the hole injection layer 47 (disposed between the semi-transparent metal layer 99 and the light-scattering layer 47a) is added to FIG. 7's Example BL1 of the organic light-emitting device having the light-scattering layer 47a. The semi-transparent metal layer 99 has a transmittance and to reflect partially light, and may be at least one thin film that Ag and MoO₃ are contained therein similarly to FIG. 6's Example BL.

Although the optical paths of EL emission light and ambient light in the light-emitting layer 49 of the organic light-emitting device shown in FIG. 12 are similar to those of the organic light-emitting device shown in FIGS. 5 and 6, but, somewhat light within the light rays toward the anode 46, e.g., the light ray travelling along with the light-emitting layer 49 passes through the semi-transparent metal layer 99 and is scattered by the Rayleigh scattering of the light-scattering layer 47a. The scattered light ray goes out from the anode 46 to the outside of the organic light-emitting device as an output light. Since the light-scattering layer 47a improves the light extraction yield of the organic light-emitting device, the degree of contrast throughout the device increases.

Embodiments

<Criterion Example ref>: A organic EL device with a configuration of glass substrate/transparent electrode/hole transport layer/organic light-emitting layer/electron injection layer/reflective electrode/was fabricated.

An ITO (Indium Tin Oxide) transparent electrode was formed on a glass substrate by a room temperature sputtering. Then there were formed on the ITO transparent electrode in turn a hole transport layer of NPB (naphthylpentylbenzidine) at a 70 nm thickness, an electron transportable organic light-emitting layer of Alq3 (tris(8-hydroxyquinolinato)aluminium, a green luminescence dye) at a 60 nm thickness, and then finally a reflective electrode of aluminum at a 80 nm thickness, by a vacuum evaporation method.

<Criterion Example ref with a polarizing plate>: A organic EL device with a configuration of glass substrate/transparent electrode/hole transport layer/organic light-emitting layer/electron injection layer/reflective electrode/was fabricated.

The Criterion Example ref of the organic EL device was fabricated and then, a polarizing plate was adhered on its glass substrate.

<Example NP-t>: A organic EL device with a configuration of glass substrate/transparent electrode/light-scattering layer/hole transport layer/organic light-emitting layer/electron injection layer/reflective electrode/was fabricated.

An organic EL device was fabricated similarly to the Criterion Example ref, excepting that a light-scattering layer of hole injection layer of PEDOT (Poly(3,4-ethylenedioxythiophene)) mixed with silica nanoparticles (SiO₂)(7 wt %) with particle size of 11 nm was formed at a 31 nm thickness on an ITO transparent electrode formed on a glass substrate, by using a spin-coating and baking (200° C.) of a PEDOT solution, and then, a NPB hole transport layer was deposited at a 39 nm thickness on the light-scattering layer. The PEDOT solution was prepared previously to include PEDOT and PSS (polystyrene sulfonate) and IPA (isopropyl alcohol) and then, the silica nanoparticles were added thereto for the coating.

<Example NP-r>: A organic EL device with a configuration of glass substrate/transparent electrode/light-scattering layer/hole transport layer/organic light-emitting layer/electron injection layer/reflective electrode/was fabricated.

An organic EL device was fabricated similarly to the Example NP-t, excepting that a light-scattering layer of hole injection layer of PEDOT mixed with silver nanoparticles (Ag)(50 wt %) with particle size of 8 nm-10 nm, instead of silica nanoparticles, was formed at a 45 nm thickness on an ITO transparent electrode formed on a glass substrate, by using a spin-coating and baking (200° C.) of a PEDOT solution, and then, a NPB hole transport layer was deposited at a 25 nm thickness on the light-scattering layer. The PEDOT solution was prepared previously and the silver nanoparticles were added thereto for the spin coating.

<Example BL>: A organic EL device with a configuration of glass substrate/transparent electrode/hole injection layer/semi-transparent metal layer/hole transport layer/organic light-emitting layer/electron injection layer/reflective electrode/was fabricated.

An organic EL device was fabricated similarly to the Criterion Example ref, excepting that a hole injection layer of PEDOT without silica and silver nanoparticles was formed at a 30 nm thickness on an ITO transparent electrode formed on a glass substrate, by using a spin-coating and baking (200° C.) of a PEDOT solution, and then, semi-transparent metal layers of Ag and MoO₃ having 15 nm and 3 nm thicknesses respectively were deposited in turn on the hole injection layer, by using a vacuum evaporation method, and then, a NPB hole transport layer was deposited at a 42 nm thickness on the semi-transparent metal layer. The PEDOT solution was prepared previously and the silver nanoparticles were added thereto for the spin coating. In the spin-coating Of PEDOT, only the PEDOT solution was used.

<Example BL1(1)>: A organic EL device with a configuration of glass substrate/transparent electrode/light-scattering layer/semi-transparent metal layer/hole transport layer/organic light-emitting layer/electron injection layer/reflective electrode/was fabricated.

An organic EL device was fabricated similarly to the Example BL, excepting that a light-scattering layer of hole injection layer of PEDOT mixed with silica nanoparticles (SiO$_2$) (7 wt %) with particle size of 11 nm was formed at a 31 nm thickness on an ITO transparent electrode formed on a glass substrate, by using a spin-coating and baking (200° C.) of a PEDOT solution, and then, the semi-transparent metal layers were deposited in turn.

<Example BL1(2)>: A organic EL device with a configuration of glass substrate/transparent electrode/light-scattering layer/semi-transparent metal layer/hole transport layer/organic light-emitting layer/electron injection layer/reflective electrode/was fabricated.

An organic EL device was fabricated similarly to the Example BL, excepting that a light-scattering layer of hole injection layer of PEDOT mixed with silver nanoparticles (Ag)(50 wt %) with particle size of 8 nm-10 nm, instead of silica nanoparticles, was formed at a 45 nm thickness on an ITO transparent electrode formed on a glass substrate, by using a spin-coating and baking (200° C.) of a PEDOT solution, and then, semi-transparent metal layers were deposited in turn.

<Example BL2>: A organic EL device with a configuration of glass substrate/transparent electrode/particulate film/hole injection layer/hole transport layer/organic light-emitting layer/electron injection layer/reflective electrode/was fabricated.

An organic EL device was fabricated similarly to the Criterion Example ref, excepting that a particulate film of silver nanoparticles (Ag) with a particle size of 8 nm-10 nm was formed at a 24 nm thickness on an ITO transparent electrode formed on a glass substrate, by using a spin-coating of a silver nanoparticles mixture solution and a baking (200° C.), and then a hole injection layer of PEDOT without silica and silver nanoparticles was formed at a 32 nm thickness on the particulate film, by using a spin-coating and baking (200° C.) of a PEDOT solution, and then, a NPB hole transport layer was deposited at a 42 nm thickness on the hole injection layer. In the spin-coating of the silver nanoparticles mixture solution, this solution was prepared with an alcohol solution mixed with silver nanoparticles. In the case that these minute metal particles were deposited with the spin coating and the particulate film had conductivity in the substrate plane direction, then an emission area of the device increased more than that of the ITO anode. Therefore, it would be necessary to perform a patterning process of a film of metal nanoparticles for a regulation emission area. However, the inventor discovered that, when a thin particulate film was formed at a thickness of 43 nm or less on an ITO film to be a discontinuous Ag nanoparticles cohesion configuration, then contacts between cohesions were missing, so that the conductivity in the substrate plane direction had vanished. Therefore, as a merit, such a thin particulate film enables no necessity for performing a patterning process of the particulate film such as the Ag nanoparticles layer or the like for a regulation emission area. In the spin-coating Of PEDOT, only the PEDOT solution was used.

<Example BL3>: A organic EL device with a configuration of glass substrate/transparent electrode/particulate film/hole injection layer/semi-transparent metal layer/hole transport layer/organic light-emitting layer/electron injection layer/reflective electrode/was fabricated.

An organic EL device was fabricated similarly to the Example BL3, excepting that semi-transparent metal layers of Ag and MoO$_3$ having 15 nm and 3 nm thicknesses respectively were deposited in turn on the PEDOT hole injection layer, by using a vacuum evaporation method, and then, a NPB hole transport layer was deposited at a 42 nm thickness on the semi-transparent metal layer.

<Example BL4>: A organic EL device with a configuration of glass substrate/transparent electrode/particulate film/light-scattering layer/hole transport layer/organic light-emitting layer/electron injection layer/reflective electrode/was fabricated.

An organic EL device was fabricated similarly to the Example BL2, excepting that a light-scattering layer of hole injection layer of PEDOT mixed with silica nanoparticles (SiO$_2$) (7 wt %) with particle size of 11 nm was formed at a 31 nm thickness on an ITO transparent electrode formed on a glass substrate, by using a spin-coating and baking (200° C.) of a PEDOT solution, and then, a NPB hole transport layer was deposited at a 39 nm thickness on the light-scattering layer.

<Example BL5(1)>: A organic EL device with a configuration of glass substrate/transparent electrode/particulate film/light-scattering layer/semi-transparent metal layer/hole transport layer/organic light-emitting layer/electron injection layer/reflective electrode/was fabricated.

An organic EL device was fabricated similarly to the Example BL2, excepting that a light-scattering layer of hole injection layer of PEDOT mixed with silica nanoparticles (SiO$_2$)(7 wt %) with particle size of 11 nm was formed at a 31 nm thickness on an ITO transparent electrode formed on a glass substrate, by using a spin-coating and baking (200° C.) of a PEDOT solution, and then, semi-transparent metal layers of Ag and MoO$_3$ having 15 nm and 3 nm thicknesses respectively were deposited in turn on the light-scattering layer, by using a vacuum evaporation method, and then, a NPB hole transport layer was deposited at a 42 nm thickness on the semi-transparent metal layer.

<Example BL5(1)'>: A organic EL device with a configuration of glass substrate/transparent electrode/particulate film/light-scattering layer/semi-transparent metal layer/hole transport layer/organic light-emitting layer/electron injection layer/reflective electrode/was fabricated.

An organic EL device was fabricated similarly to the Example BL5(1), excepting that hole transport layers of CuPc (Copper Phthalocyanine) and NPB were deposited in turn at 15 nm and 27 nm thicknesses respectively by a vacuum evaporation method.

<Example BL5(2)>: A organic EL device with a configuration of glass substrate/transparent electrode/particulate film/light-scattering layer/semi-transparent metal layer/hole transport layer/organic light-emitting layer/electron injection layer/reflective electrode/was fabricated.

An organic EL device was fabricated similarly to the Example BL1(1), excepting that a particulate film of silver nanoparticles (Ag) with a particle size of 8 nm-10 nm was formed at a 24 nm thickness on an ITO transparent electrode formed on a glass substrate, by using a spin-coating of a silver nanoparticles mixture solution and a baking (200° C.).

<Example BL6>: A organic EL device with a configuration of glass substrate/transparent electrode/light-scattering layer/hole injection layer/semi-transparent metal layer/hole transport layer/organic light-emitting layer/electron injection layer/reflective electrode/was fabricated.

An organic EL device was fabricated similarly to the Example BL3, excepting that a light-scattering layer of hole injection layer of PEDOT mixed with silver nanoparticles (Ag) (50 wt %) with particle size of 8 nm-10 nm, instead of silica nanoparticles, was formed at a 45 nm thickness on an ITO transparent electrode formed on a glass substrate without the particulate film.

Example organic EL devices' major elemental configurations (particulate film/hole injection layer (light-scattering layer)/semi-transparent metal layer/hole transport layer) above-mentioned are shown in the following Table 1.

TABLE 1

| Examples | Particulate film (thickness) | Hole injection layer (thickness) | Semi-transparent metal layer (thickness) | | Hole transport layer (thickness) |
|---|---|---|---|---|---|
| ref | — | — | — | — | NPB (70 nm) |
| ref' | — | — | — | — | NPB (70 nm) |
| NP-t | — | PEDOT + nano-silica (31 nm) | — | — | NPB (39 nm) |
| NP-r | — | PEDOT + Ag nanoparticles (45 nm) | — | — | NPB (25 nm) |
| BL | — | PEDOT (30 nm) | Ag (15 nm) | MoO$_3$ (3 nm) | NPB (42 nm) |
| BL1(1) | — | PEDOT + nano-silica (31 nm) | Ag (15 nm) | MoO$_3$ (3 nm) | NPB (42 nm) |
| BL1(2) | — | PEDOT + Ag nanoparticles (45 nm) | Ag (15 nm) | MoO$_3$ (3 nm) | NPB (42 nm) |
| BL2 | Ag nanoparticles (24 nm) | PEDOT (32 nm) | — | — | NPB (13 nm) |
| BL3 | Ag nanoparticles (24 nm) | PEDOT (32 nm) | Ag (15 nm) | MoO$_3$ (3 nm) | NPB (42 nm) |
| BL4 | Ag nanoparticles (24 nm) | PEDOT + nano-silica (31 nm) | — | — | NPB (39 nm) |
| BL5 (1) | Ag nanoparticles (24 nm) | PEDOT + nano-silica (31 nm) | Ag (15 nm) | MoO$_3$ (3 nm) | NPB (42 nm) |
| BL5 (1)' | Ag nanoparticles (24 nm) | PEDOT + nano-silica (31 nm) | Ag (15 nm) | MoO$_3$ (3 nm) | CuPc/NPB (15 nnm/27 nm) |
| BL5 (2) | Ag nanoparticles (24 nm) | PEDOT + Ag nanoparticles (45 nm) | Ag (15 nm) | MoO$_3$ (3 nm) | NPB (42 nm) |
| BL6 | — | PEDOT + Ag nanoparticles/PEDOT (45 nm/32 nm) | Ag (15 nm) | MoO$_3$ (3 nm) | NPB (42 nm) |

Regarding each of the Examples of the organic EL devices, a driving voltage versus luminance (luminance factor) and CIE chromaticity were measured under the predetermined electric current at a predetermined current density. The results are shown in the following Table 2.

TABLE 2

| | Driving voltage | Luminance (Luminance factor) | CIE | |
|---|---|---|---|---|
| Examples | V@7.5 mA/cm$^2$ | L@7.5 mA/cm$^2$ | x | y |
| ref | 4.4 | 323 (1) | 0.358 | 0.549 |
| ref' | 4.4 | 118 (0.36) | 0.355 | 0.558 |
| NP-t | 4.3 | 301 (0.93) | 0.349 | 0.561 |
| NP-r | | ND (emission) | | |
| BL | 5.2 | 513 (0.46) | 0.3 | 0.624 |
| BL1(1) | 4.3 | 150 (0.46) | 0.289 | 0.578 |
| BL1(2) | | — | | |
| BL2 | 4.3 | 195 (0.6) | 0.258 | 0.600 |
| BL3 | 4.8 | 243 (0.75) | 0.215 | 0.667 |
| BL4 | | ND (emission) | | |
| BL5 (1) | | ND (emission) | | |
| BL5 (1)' | | ND (emission) | | |
| BL5 (2) | | — | | |
| BL6 | 4.8 | 370 (1.15) | 0.275 | 0.625 |

The Example ref' with the circular polarized light plate had a deterioration of EL emission of 45% or less, but the other Examples had no deterioration.

There were light emissions in ND of Examples, no result value was obtained, but it is understood that interfaces of layers were rough due to use of the particulate film to leak electric currents.

Figure 13:
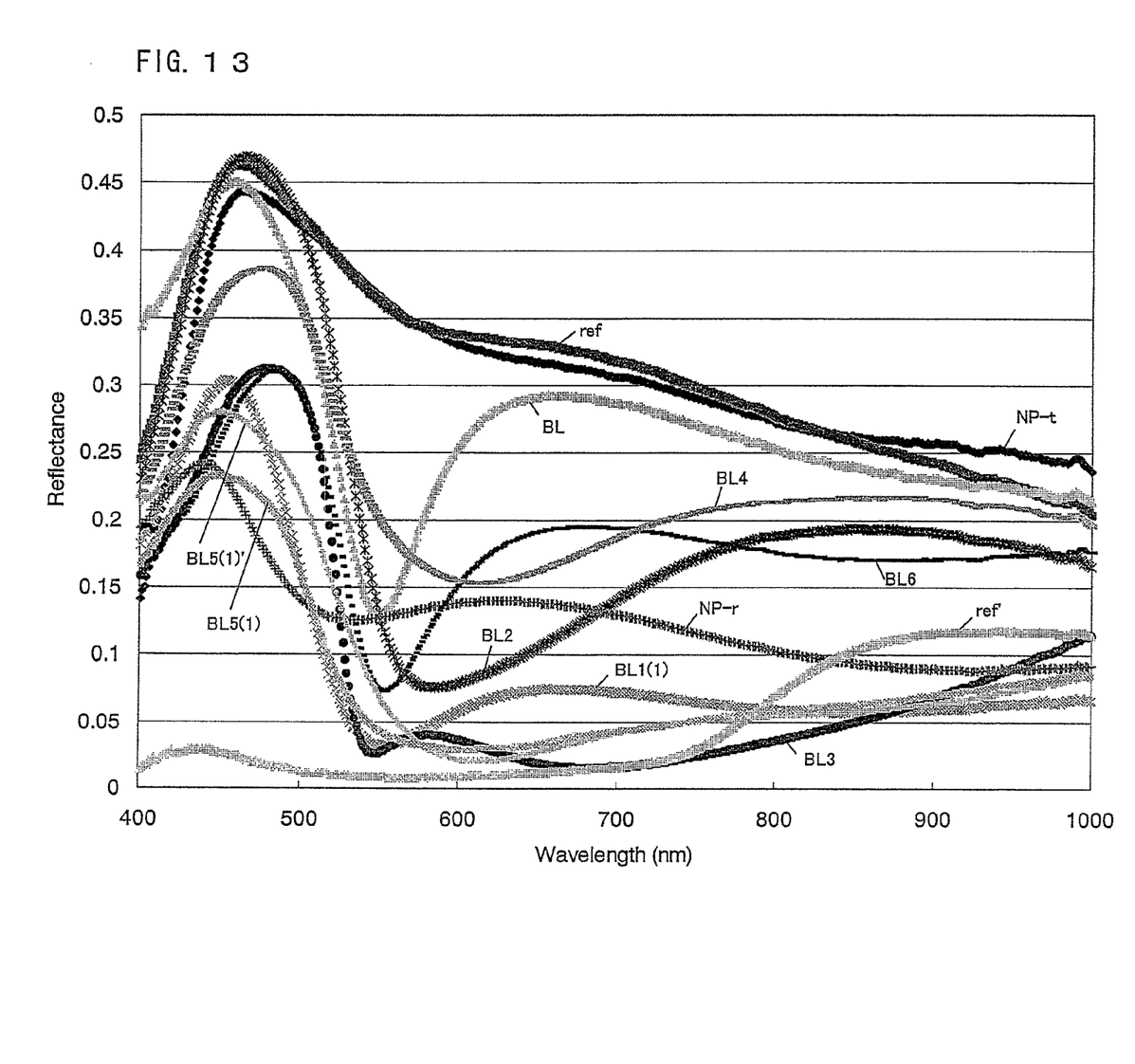
FIG. 13 is a graph showing spectrums of reflectance organic exhibited by light-emitting devices of embodiments according to the present invention.

Reflection spectra of the Examples of the organic EL devices were measured. The results are shown in FIG. 13.

Ambient light reflectance ratios to predetermined wavelengths in the reflection spectrums of the Examples of the organic EL devices were measured to evaluate degrees of EL luminance light and interruption of ambient light. The results are shown in the following Table 3. The ambient light reflectance ratio denotes a normalized value (ratio) of interest when a reflectance of Example ref at a selected visible light wavelength is regarded as 1. There were some devices having the reduced reflectance of 10% or less of the Example ref device's value.

In Table 3, if an EL luminance of device of interest is higher than that of the Example ref' device using the circular polarized light plate, then judgment of EL luminance performance is ○ indicated. If a reflectance of device of interest at a 550 nm wavelength is reduced, then judgment of ambient light cut off performance (reflectance) is ○ indicated.

TABLE 3

| | | | | Judgments | |
|---|---|---|---|---|---|
| | Ambient light reflectance ratio at wavelength | | | | Ambient light cut off (reflectance) |
| Examples | 450 nm | 550 nm | 650 nm | EL luminance | @550 nm |
| ref | 1 | 1 | 1 | — | — |
| ref' | 0.06 | 0.02 | 0.04 | — | — |
| NP-t | 1.05 | 1 | 1.04 | ○ | X |
| NP-r | 0.54 | 0.35 | 0.44 | ND (○) | X |
| BL | 1.05 | 0.36 | 0.92 | ○ | X |
| BL1(1) | 0.70 | 0.09 | 0.23 | ○ | ○ |
| BL1(2) | | — | | | — |
| BL2 | 1.05 | 0.36 | 0.320 | ○ | X |
| BL3 | 0.65 | 0.07 | 0.06 | ○ | ○ |
| BL4 | 0.85 | 0.55 | 0.51 | ND (○) | X |
| BL5 (1) | 0.65 | 0.19 | 0.09 | ND (○) | Δ |
| BL5 (1)' | 0.54 | 0.12 | 0.10 | ND (○) | ○ |

TABLE 3-continued

| | Ambient light reflectance ratio at wavelength | | | Judgments | Ambient light cut off (reflectance) |
|---|---|---|---|---|---|
| Examples | 450 nm | 550 nm | 650 nm | EL luminance | @550 nm |
| BL5 (2) | — | | | | — |
| BL6 | 0.61 | 0.19 | 0.60 | ○ | Δ |

As seen from the results of the Example organic EL devices, it is found that there are shown moderate ambient light cut off characteristics in the devices each including the light-scattering layer of hole injection layer, i.e., a light-scattering layer that comprises: organic materials having carrier injection and transport characteristics; and plural particles dispersed among the organic materials.

The organic light-emitting device of Examples above-mentioned may be modified in each layer as follows.

Layered Configuration of Modified Examples

Although the foregoing Examples of a bottom emission type organic light-emitting device are described mainly, but embodiments may be adapted to a top emission type organic light-emitting device in which lights L1, L2 emitted by the light-emitting layer 49 are output from the transparent cathode 52.

Figure 14:
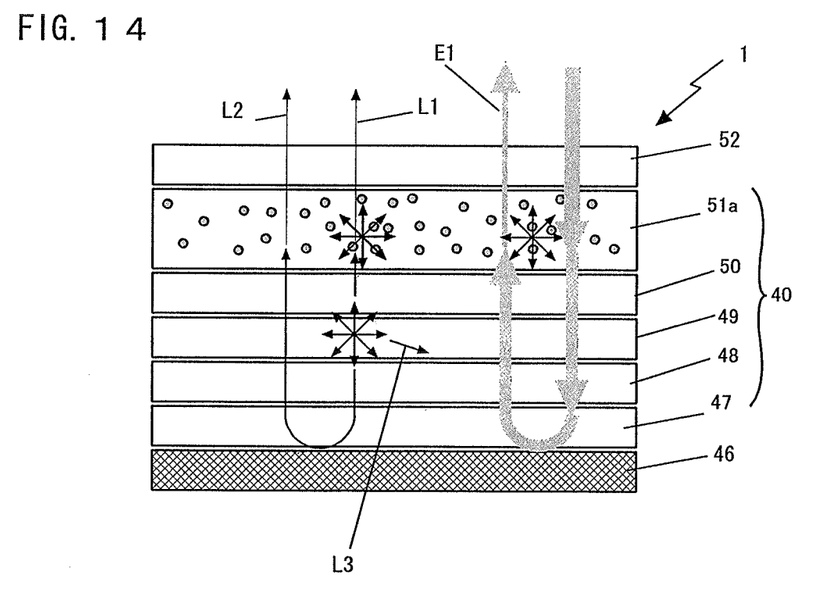
FIG. 14 is a schematic image diagram showing a cross-section of an organic light-emitting device of another embodiment according to the present invention for explaining typical optical paths.

For example, as shown in FIG. 14, an organic light-emitting device 1 may be configured in such a manner that the electron injection layer of the light-scattering layer 51a is formed between the transparent cathode 52 and the electron transport layer 50. This configuration improves the light extraction yield.

Figure 15:
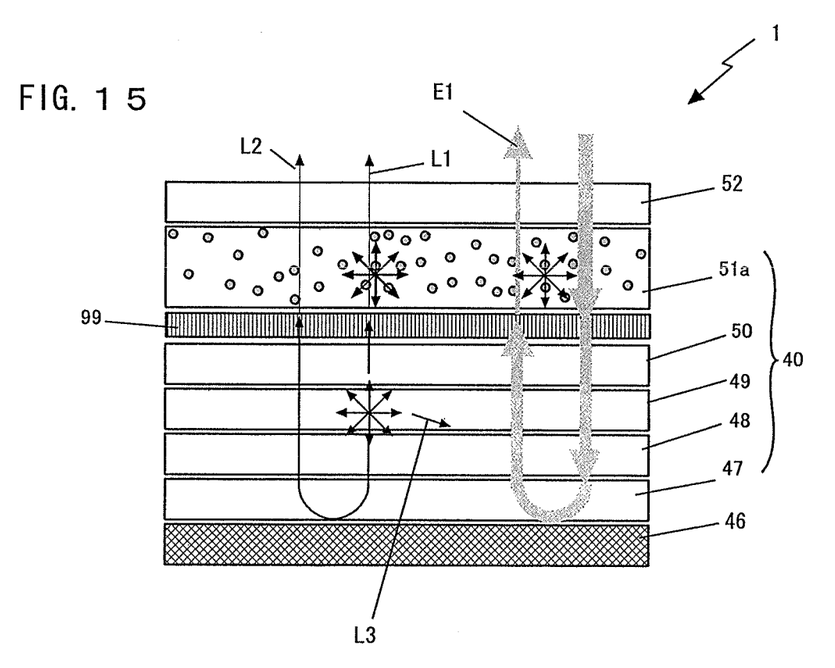
FIG. 15 is a schematic image diagram showing a cross-section of an organic light-emitting device of another embodiment according to the present invention for explaining typical optical paths.

Further, as shown in FIG. 15, an organic light-emitting device 1 may be configured in such a manner that the electron injection layer of the light-scattering layer 51a and the semi-transparent metal layer 99 are arranged in turn from the transparent cathode 52 and formed between the transparent cathode 52 and the electron transport layer 50. This configuration also improves the light extraction yield. In the organic light-emitting devices as shown in both Figures, the hole injection layer 47, the hole transport layer 48, the organic light-emitting layer 49, the electron transport layer 50 are formed in turn on the reflective anode.

As described above, it is preferable that at least one of the organic semiconductor layers 40 disposed between the organic light-emitting layers 40 and the anode 46 or the cathode 52 is set to be a light-scattering layer comprises: organic materials having carrier injection and transport characteristics of transporting electrons and/or holes; and plural particles dispersed among the organic materials so that light emitted from the organic light-emitting layer is passed therethrough. This configuration improves the light extraction yield as mentioned above.

The invention claimed is:

1. An organic light-emitting device comprising:
a pair of first and second electrodes opposed to each other; and
a plurality of organic semiconductor layers layered and disposed between said first and second electrodes, wherein said organic semiconductor layers include an organic light-emitting layer and carrier injection and or or transport layers sandwiching the organic light-emitting layer,
the organic semiconductor device further comprising a light-scattering layer layered and disposed between said organic light-emitting layer and one of said first and second electrodes placed on a side of extracting light to an outside,
wherein said light-scattering layer comprises: organic materials having carrier injection and transport characteristics of transporting electrons and or or holes; and plural particles dispersed among the organic materials so that light emitted from the organic light-emitting layer is passed therethrough,
wherein the organic light-emitting device further comprises a semi-transparent metal layer so that the semi-transparent metal layer and the light-scattering layer are disposed between one of carrier injection and or or transport layers and the one of said first and second electrodes placed on the side of extracting light to the outside,
wherein the semi-transparent metal layer is capable of partially reflecting light and has a light transparency,
the organic light-emitting device further comprising a particulate film disposed between said light-scattering layer and the one of said first and second electrodes placed on the side of extracting light to the outside wherein the particulate film contains plural particles.

2. The organic light-emitting device according to claim 1, wherein said particles each has an acicular shape, cylinder shape, plate shape, rectangular parallelepiped shape, cube shape, cone shape, spherical shape, prism shape, or the like as an individual, or aggregation thereof.

3. The organic light-emitting device according to claim 1, wherein said particles have an average particle size of from 0.1 nm to 10000 nm.

4. The organic light-emitting device according to claim 1, wherein said particles are dispersed at a density so that a distance between adjacent particles is within a range of 0.1 nm or more and 1 μm or less.

5. The organic light-emitting device according to claim 1, wherein a material of said particles has a refractive index satisfying a refractive index difference of 0.01 or more different from a refractive index of said organic materials.

6. The organic light-emitting device according to claim 1, wherein a material of said particles is a metal, oxide, complex oxide, fluoride, or polymer material.

7. The organic light-emitting device according to claim 1, wherein said light-scattering layer has an unevenly rough interface with a difference of elevation of 0.1 nm or more and 1000 nm or less.

8. The organic light-emitting device according to claim 1, wherein said light-scattering layer has a carrier mobility of $1 \times 10^{-10}$-$1 \times 10^{10}$ cm$^2$/Vs, or a conductivity of $10^{10}$-$10^{-10}$ Ω·cm.

9. The organic light-emitting device according to claim 1, wherein the particles of said particulate film are made of an oxide, complex oxide, fluoride, or metal, wherein said particulate film is a cohesion film having an organic binder that coheres the particles of said particulate film.

10. The organic light-emitting device according to claim 1, wherein said particulate film has a conductivity.

11. The organic light-emitting device according to claim 1, wherein said particulate film has a carrier mobility of $1 \times 10^{-10}$-$1 \times 10^{10}$ cm$^2$/Vs, or a conductivity of $10^{10}$-$10^{-10}$ Ω·cm.

12. The organic light-emitting device according to claim 1, wherein said particulate film is in contact with the one of said first and second electrodes placed on the side of extracting light to the outside.

13. The organic light-emitting device according to claim 1, wherein one of the first electrode or the second electrode on a side of extracting light to an outside is a transparent or semi-transparent electrode, wherein another of the first electrode or the second electrode on another side opposite to the side of extracting light is a reflective electrode.

14. The organic light-emitting device according to claim 1, said semi-transparent metal layer has a thickness of 10 nm or more and 50 nm or less.

15. The organic light-emitting device according to claim 1, wherein the one of said first and second electrodes placed on the side of extracting light to the outside is an anode, wherein the organic semiconductor layers existing between the anode and the organic light-emitting layer include at least one both of a hole injection layer for facilitating to extract holes from the anode contacted therewith and a hole transport layer for transporting holes to the organic light-emitting layer.

16. The organic light-emitting device according to claim 15, wherein another of said first and second electrodes placed on a side opposite to the side of extracting light to the outside is a cathode, wherein the organic semiconductor layers existing between the cathode and the organic light-emitting layer include at least one both of an electron injection layer for facilitating to extract electrons from the cathode contacted therewith and an electron transport layer for transporting electrons to the organic light-emitting layer.

\* \* \* \* \*